(12) United States Patent  
Chuang et al.

(10) Patent No.: US 9,276,010 B2  
(45) Date of Patent: Mar. 1, 2016

(54) DUAL SILICIDE FORMATION METHOD TO EMBED SPLIT GATE FLASH MEMORY IN HIGH-K METAL GATE (HKMG) TECHNOLOGY

(71) Applicant: Taiwan Semiconductor Manufacturing Co., Ltd., Hsin-Chu (TW)

(72) Inventors: Harry-Hak-Lay Chuang, Zhubei (TW); Wei Cheng Wu, Zhubei (TW); Ya-Chen Kao, Fuxing Township (TW); Fang-Lan Chu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/296,496

(22) Filed: Jun. 5, 2014

(65) Prior Publication Data

US 2015/0333082 A1 Nov. 19, 2015

Related U.S. Application Data

(60) Provisional application No. 61/994,508, filed on May 16, 2014.

(51) Int. Cl.
| | |
|---|---|
| *H01L 29/88* | (2006.01) |
| *H01L 21/336* | (2006.01) |
| *H01L 27/115* | (2006.01) |
| *H01L 29/792* | (2006.01) |
| *H01L 29/78* | (2006.01) |
| *H01L 29/66* | (2006.01) |

(52) U.S. Cl.
CPC .... *H01L 27/11573* (2013.01); *H01L 29/66484* (2013.01); *H01L 29/66833* (2013.01); *H01L 29/7831* (2013.01); *H01L 29/792* (2013.01)

(58) Field of Classification Search
CPC ............... H01L 29/66628; H01L 27/10876; H01L 27/10894; H01L 29/7834; H01L 27/10814
USPC ........................... 257/315, 316, 327; 438/257
See application file for complete search history.

(56) References Cited

U.S. PATENT DOCUMENTS

| | | | |
|---|---|---|---|
| 2008/0029805 A1* | 2/2008 | Shimamoto et al. | .......... 257/315 |
| 2012/0132978 A1 | 5/2012 | Toba et al. | |
| 2012/0299084 A1 | 11/2012 | Saito et al. | |
| 2014/0065809 A1 | 3/2014 | Kim et al. | |

OTHER PUBLICATIONS

Non Final Office Action Dated Oct. 2, 2015 KR Patent Application No. 10-2014-0187183.

* cited by examiner

*Primary Examiner* — Evan Pert  
*Assistant Examiner* — Changhyun Yi  
(74) *Attorney, Agent, or Firm* — Eschweiler & Associates, LLC

(57) ABSTRACT

The present disclosure relates to a structure and method for embedding a non-volatile memory (NVM) in a high-K metal gate (HKMG) integrated circuit that utilizes a replacement gate technology with low poly resistance and high program/erase speed. A silicide layer formed over top surfaces of the NVM device, after replacement gate process of the HKMG circuit prevents poly damage during contact formation and provides low gate resistance, thereby improving program/erase speed of the NVM device.

20 Claims, 15 Drawing Sheets

DUAL SILICIDE FORMATION METHOD TO EMBED SPLIT GATE FLASH MEMORY IN HIGH-K METAL GATE (HKMG) TECHNOLOGY

REFERENCE TO RELATED APPLICATIONS

The present application claims priority to U.S. provisional application filed on May 16, 2014, which has an Application No. of 61/994,508 and is entitled "Dual Silicide Formation Method to Embed Flash Memory in HKMG Technology", the contents of which are incorporated herein in their entirety.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode with a metal gate electrode to improve device performance with the decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
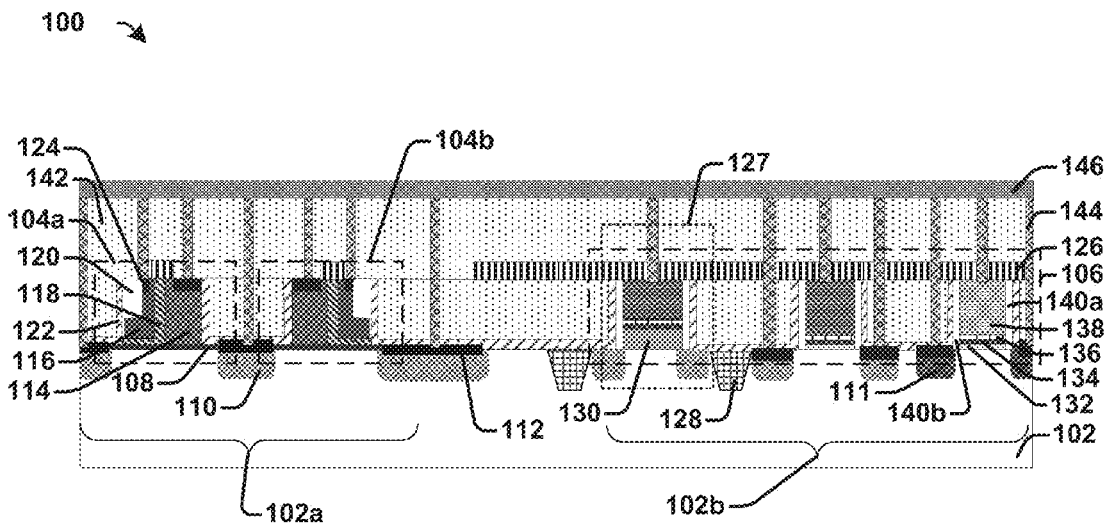
FIG. 1 illustrates a cross sectional view of an integrated circuit with a pair of embedded flash memory cells, having a silicide layer disposed partially over top surfaces of both memory gates and select gates, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to lower manufacturing cost, simplify the manufacturing procedures, and increase operational speed for a semiconductor device, a trend in semiconductor manufacturing is to integrate different devices, such as a memory cell and a logic circuit, on the same wafer. An example of this is modern embedded flash memory devices. These embedded flash memory devices include an array of flash memory cells and periphery circuitry formed on the same wafer. High-k metal gate (HKMG) technology has become one of the front-runners for the next generation of CMOS devices, and this technology incorporates a high-k dielectric, which reduces leakage and improves the dielectric constant. To help with fermi-level pinning and to allow the gate to be adjusted to low threshold voltages, a metal gate is used instead of a polysilicon gate. By combining the metal gate and low-k dielectric, HKMG technology reduces gate leakage, thereby increasing the transistor capacitance and allowing chips to function with reduced power needs. Thus, integrating non-volatile memory (NVM) devices (flash memory devices) with HKMG logic devices is a technology that enables conventional scaling of the transistor as well as reduction in stand-by power due to a reduction in gate leakage. Split gate flash memory cells have promising advantages over stacked gate memory cells such as low power consumption, high injection efficiency, less susceptibility to short channel effects, and over erase immunity. The built in select gate transistor in a split gate memory cell can effectively get rid of the on-chip erase procedures that were used in traditional stacked gate cells to resolve over erase problems.

As device size and channel length keeps decreasing, the gate resistance increases and embedded flash memory devices have poor program/erase speed due to high poly resistance. Further, an etching process, which is performed to create openings for metal contacts, touches the poly silicon surface of the memory device gates and causes damage on top surfaces of the poly gates, which can further induce problems with proper device operations.

Accordingly, the present disclosure relates to a new processing method and structure for an integrated circuit, which reduces gate resistance in flash memory devices integrated with HKMG process. A silicide layer is formed over the top surface of the poly gates to improve the contact resistance and/or reduce the poly gate resistance, thereby improving the device speed in embedded memory devices. Further, silicides have good process compatibility with Si, little or no electro-migration and they provide good contact to other materials. In this disclosure, a hard mask layer or dielectric protection layer is formed to protect the HKMG device during silicide formation. A first dielectric protection layer or contact etch stop layer (CESL) is already formed during the initial processing steps, which along with the hard mask layer gives rise to dual dielectric layer at certain locations on the integrated circuit. Hence, in locations where a dual dielectric is observed, the contact electrodes will have to pass through two layers of dielectric material to touch the active regions on the substrate. Thus, contact formation through dual dielectric layer is a feature of this embodiment. A first salicide or self-aligned silicide layer is usually formed on the base surface of the semiconductor substrate above the source/drain regions. Thus, forming a silicide over the top surface of the poly gates gives rise to a dual silicide structure as well. Hence, the silicide over top surfaces of the poly gates can be addressed as a second silicide. A split gate flash memory cell typically has a select gate (SG) and a memory gate (MG). The second silicide can be formed over the flash memory cell in many different ways. In one embodiment, a second silicide is formed partially over top surfaces of the MG and the SG. In another embodiment, the second silicide layer is formed completely over the top surfaces of the MG and the SG. In yet another embodiment, the second silicide is formed only over the top surface of the SG, wherein the MG comprises only poly silicon. In yet another embodiment, the second silicide is formed only over the top surface of the MG, wherein the SG comprises only poly silicon.

FIG. 1 illustrates a cross sectional view of an integrated circuit 100 with a pair of embedded flash memory cells, having a silicide layer disposed partially over top surfaces of both memory gates and select gates of the memory cells, according to one embodiment of the present disclosure. Integrated circuit 100 resides on a Si substrate 102 which has a memory region 102a and a periphery region 102b. A pair of adjacent flash memory cells 104a and 104b resides on the memory region 102a and a high-k metal gate (HKMG) circuit 106 resides over the periphery region 102b. The memory cells 104a and 104b reside over a base dielectric layer 108 (disposed over a base surface of the semiconductor substrate 102) and memory cell 104a is a mirror image of the memory cell 104b. Source/drain regions 110 are disposed within the substrate 102. Reference numeral 110 represent n-type source/drain implants while 111 represent p-type source/drain implants. A base silicide layer 112 resides over the semiconductor substrate above the source/drain regions 110 and 111. Each flash memory cell 104a and 104b comprises a select gate (SG) 114, a memory gate (MG) 116, a charge-trapping layer 118 which extends below the MG 116, and a side wall spacer 120 which abuts an outer sidewall of the MG 116. In some embodiments, the MG 116 can have a square or rectangle shape, rather than an 'L' shape, as illustrated in this embodiment. A contact etch-stop layer (CESL) 122 resides over the base of the semiconductor substrate above the base silicide layer as well as on the outer sidewalls of the SGs and the sidewall spacers of each memory cell 104a and 104b and the HKMG transistors. A silicide layer 124 is disposed partially over top surfaces of the SG 114 and the MG 116 which improves the contact resistance of the gates. A hard mask layer 126 protects the HKMG circuit 106 and parts of the memory cells 104a and 104b during the formation of silicide 124. Partially covering the top surfaces of the MG 116 and the SG 114 with silicide 124, (or protecting the charge trapping layer 118 and edges of the SG 114 and MG 116 from silicide formation with the hard mask 126), prevents unwanted electron migration and any chances of a breakdown between the SG 114 and MG 116. In other words, by leaving silicide 124 "pulled back" from edges of the charge trapping layer 118 (e.g., by leaving hard mask 126 overlapping at least partially over SG 114) chances of voltage breakdown are lessened, even when high voltages are applied to SG 114 during normal flash operation.

The HKMG circuit 106 includes a high voltage (HV) HKMG transistor 127 which is isolated from the rest of the circuit by shallow trench isolation (STI) regions 128. In some embodiments, rest of the low voltage HKMG periphery circuit comprises a static random access memory (SRAM) cell, an input/output cell or a core cell. The HV HKMG transistor 127 resides over a thick HV gate oxide 130, while the rest of the low voltage HKMG periphery circuit resides over a thin gate oxide layer 132. All of the HKMG transistors of the HKMG circuit 106 comprise a high-k dielectric layer 134, which resides over the gate oxides 130 and 132, an etch-stop layer (ESL) 136 residing over the high-k dielectric layer 134, and metal gate 138 residing over the ESL 136. Sidewall spacers 140a and 140b are disposed on either side of these layers for each of the transistors. An inter-layer dielectric (ILD) layer 142 is deposited entirely over the devices, covering their top surfaces as well as surrounding them. Metal contacts 144 extend to all the active regions on the integrated circuit 100. A protective barrier layer 146 is disposed above the metal contacts 144 and the ILD layer 142.

As will be appreciated in greater detail below, the silicide layer 124 reduces high poly resistance by providing a better low resistance contact surface for the metal contacts 144 and also prevents poly damage that is caused during contact etching. Thus the dual silicide formation thereby increases the program/erase speed of the embedded NVM device of the integrated circuit by reducing the poly resistance. During operation, the first and second memory cells 104a, 104b can each be thought of as two transistors in series. Within each cell, one transistor is the memory gate transistor (e.g., corresponding to MG 116), and the other is the select gate transistor (e.g. corresponding to SG 114) which is controlled by a word line. Programming is performed by means of source-side channel hot-electron injection. Poly-to-poly Fowler-Nordheim (FN) electron tunneling is employed for erasing. To change the cell value to a "0", a negative electrical potential is applied to both the MG and SG transistors, such that the electrons stored in the charge-trapping layer (e.g., 118) are drained to the source side of the memory cell (e.g., 110). The electrons in the cells of a chip can be returned to normal "1" by the application of a strong positive electric field. Because the electrons tend to remain in the charge-trapping layer even when power is disconnected from the chip, the flash memory cells are said to be "non-volatile."

Figure 2:
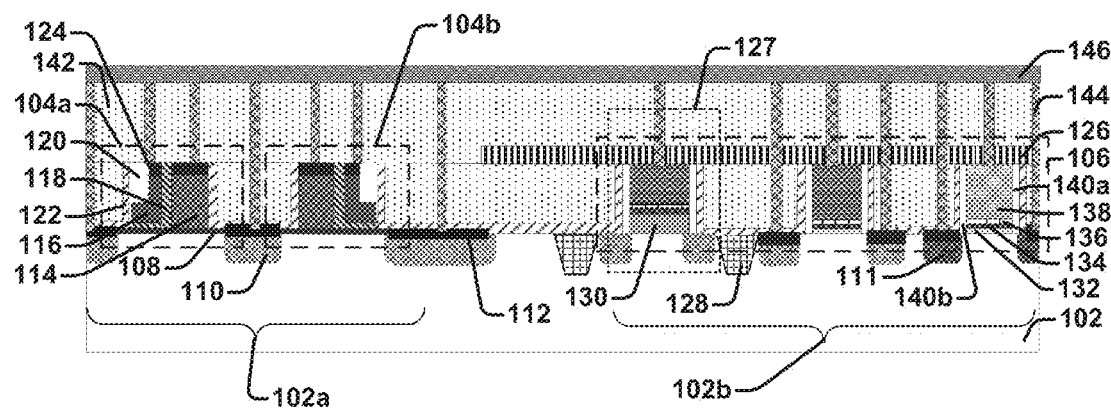
FIG. 2 illustrates a cross sectional view of an integrated circuit with a pair of embedded flash memory cells, having a silicide layer disposed completely over top surfaces of both the select gates and the memory gates, according to some embodiments of the present disclosure.

FIG. 2 illustrates a cross sectional view of an integrated circuit 200 with a pair of embedded flash memory cells, having a silicide layer 124 disposed completely over top surfaces of both the select gates 114 and the memory gates 116, according to one embodiment of the present disclosure. In this embodiment, the hard mask layer 126 only covers the HKMG circuit 106, thereby allowing silicide (124) formation over the top surfaces of the SG 114 and the MG 116 completely on both memory cells 104a and 104b. FIG. 2's embodiment is advantageous in that it does not necessarily require high-resolution lithography techniques such as double-patterning, and therefore may offer cost savings compared to some other embodiments.

Figure 3:
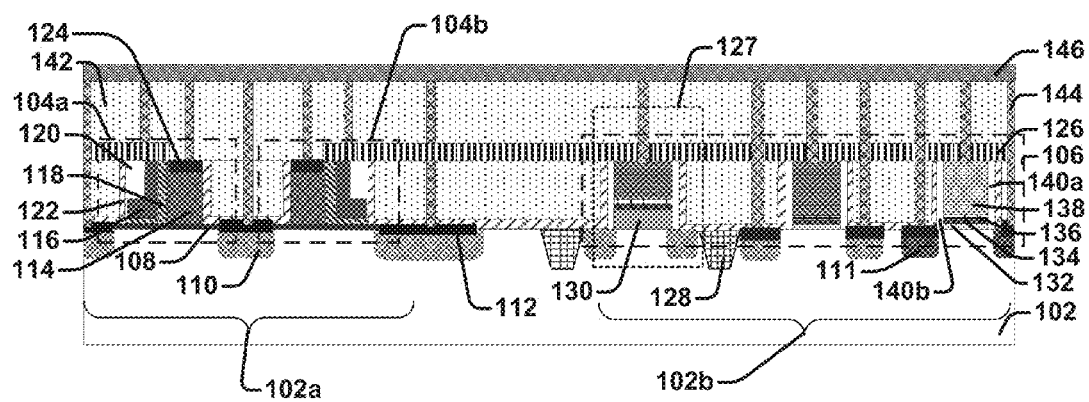
FIG. 3 illustrates a cross sectional view of an integrated circuit with a pair of embedded flash memory cells, having a silicide layer disposed over top surfaces of the select gates, according to some embodiments of the present disclosure.

FIG. 3 illustrates a cross sectional view of an integrated circuit 300 with a pair of embedded flash memory cells, having a silicide layer disposed over top surfaces of the select gates, according to one embodiment of the present disclosure. In this embodiment, the hard mask layer 126 covers the HKMG circuit 106 and part of the memory cells 104a and 104b, leaving an opening over the SG 114 of both memory cells 104a and 104b. A small predetermined distance over the edge of the SG 114 is also protected by the hard mask 126 to limit unwanted electron migration, hot carrier effects, or other parasitic leakage leading to breakdown between SG 114 and MG 116.

Figure 4:
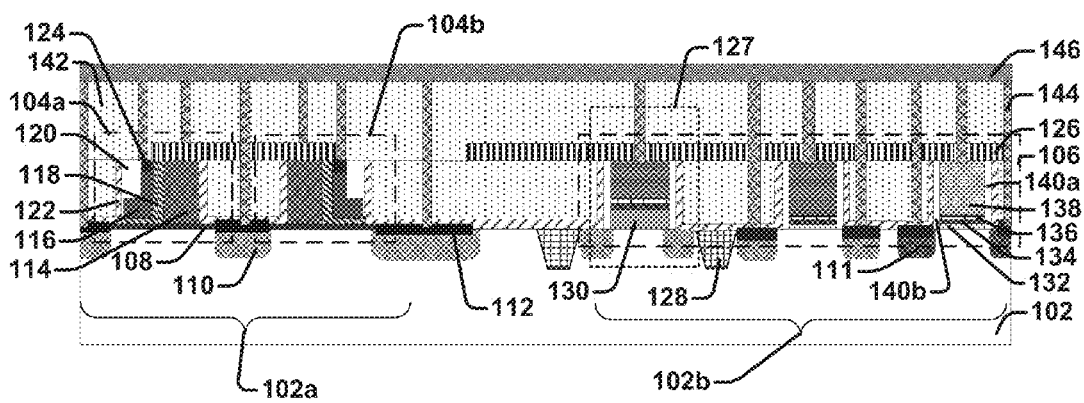
FIG. 4 illustrates a cross sectional view of an integrated circuit with a pair of embedded flash memory cells, having a silicide layer disposed over top surfaces of the memory gates, according to some embodiments of the present disclosure.

FIG. 4 illustrates a cross sectional view of an integrated circuit 400 with a pair of embedded flash memory cells, having a silicide layer 124 disposed over top surfaces of the memory gates, according to some embodiments of the present disclosure. In this embodiment, the hard mask layer 126 covers the HKMG circuit 106 and part of the memory cells 104a and 104b, leaving an opening over the MG 116 of both memory cells 104a and 104b. A small predetermined distance over the edge of the MG 116 is also protected by the hard mask 126 to limit unwanted electron migration and other parasitic leakage leading to breakdown between SG 114 and MG 116. Further, this embodiment may also limit the need for high-resolution lithography techniques and thus may be particularly economical compared to some other approaches.

Figure 5:
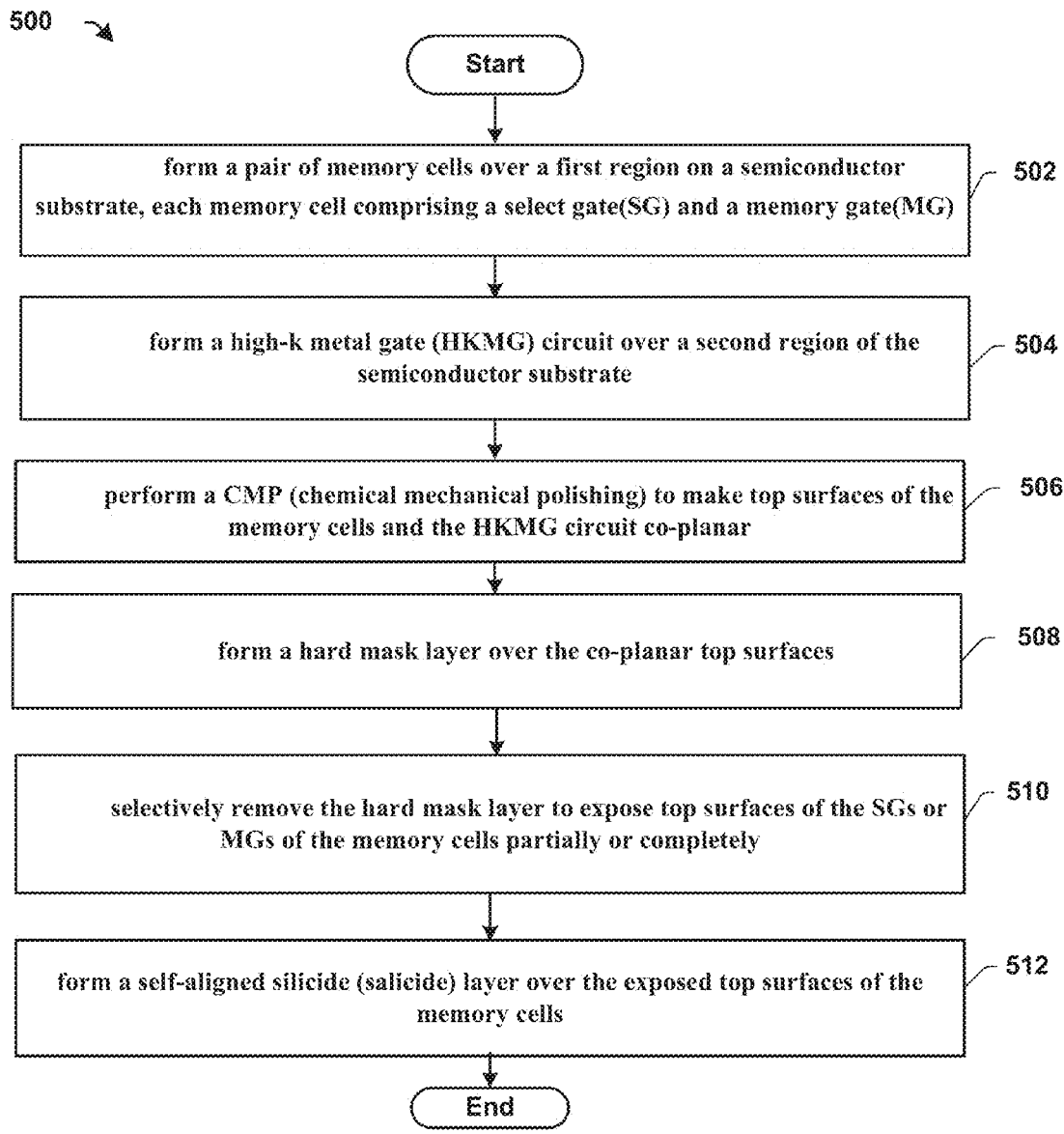
FIG. 5 illustrates a flow diagram of some embodiments of a method for forming an integrated circuit according to the present disclosure.

FIG. 5 illustrates a flow diagram of some embodiments of a method 500, for forming an integrated circuit according to the present disclosure. While disclosed method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a pair of memory cells is formed over a first region on a semiconductor substrate, each memory cell comprising a select gate (SG) and a memory gate (MG).

At 504, a high-k metal gate (HKMG) circuit is formed over a second region of the semiconductor substrate.

At 506, a CMP (chemical mechanical polishing) operation is performed to make top surfaces of the memory cells and the HKMG circuit co-planar.

At 508, a hard mask layer is formed over the co-planar top surfaces.

At 510, the hard mask layer is selectively removed to expose top surfaces of the SGs or MGs of the memory cells partially or completely.

At 512, a self-aligned silicide (salicide) layer is formed over the exposed top surfaces of the memory cells.

FIGS. 6-23 illustrate embodiments of cross sectional images of a step by step method for forming of a pair of memory cells with a silicide layer over their select gate and memory gate structures, according to the present disclosure. It will be appreciated that although these cross-sectional views illustrate only a pair of split-gate memory cells, in typical embodiments an integrated circuit will include thousands, millions, billions, or even greater numbers of such split gate memory cells arranged in a memory array. The final integrated circuit also includes peripheral circuitry that can utilize different process layers (e.g., HKMG and/or replacement metal gate technology), such as are used in CMOS processes. Integration of the split-gate memory cells and the peripheral circuitry has caused a number of integration and reliability issues, which are mitigated in the process flow set forth below.

In the method of formation illustrated in this embodiment, flash memories have a silicide blocking material over their SGs until a certain stage of their formation. This silicide-blocking material is formed over the top surfaces of the SGs during the base silicide formation. This silicide-blocking material prevents silicide formation on the top surfaces of the SGs during silicide formation on the active regions. Therefore, when CMP is subsequently carried out, the top surfaces of the SGs (now lacking a salicide/silicide thereon) are still subject to a CMP operation to planarize the SG top surfaces with other features on a periphery of the chip. However, because the top surfaces of the SG are free of salicides during CMP, the CMP operation will not cause contamination for the periphery of the chip. Hence, a salicide is formed on top surfaces of the SG and/or MG after this CMP operation is complete. This "split silicide" formation therefore helps alleviate contamination problems with conventional approaches, and still provides a low resistance (e.g., ohmic) contact for the various gate structures in a reliable manner.

Figure 6:
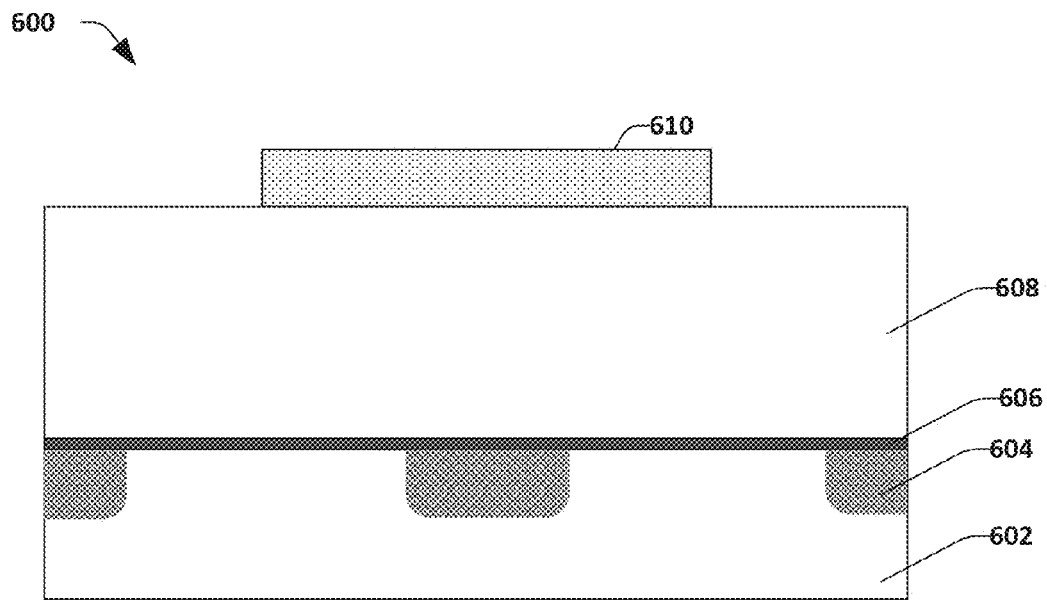
FIGS. 6-23 illustrate embodiments of cross sectional images of a step by step method of formation of a pair of memory cells with a silicide layer over their gate structures, according to the present disclosure.

FIG. 6 illustrates a cross-sectional view of a semiconductor body 600 at one of the stages of forming split gate memory cells according to some embodiments of the present disclosure. The semiconductor body 600 includes a semiconductor substrate 602 on which memory devices and peripheral devices (e.g., CMOS devices) are formed. In some embodiments, the semiconductor substrate 602 can be a bulk silicon substrate, a silicon on insulator (SOI) substrate, a binary semiconductor substrate (e.g., GaAs), tertiary semiconductor substrate (e.g., AlGaAs), or higher order semiconductor substrate, for example. Any of these substrates can include doped regions formed in the substrate, one or more insulating layers formed in or on the substrate, and/or conducting layers formed in or on the substrate.

The illustrated semiconductor substrate 602 has source/drain regions 604 that are formed, for example, by ion implantation or out-diffusion of dopants. A base dielectric layer 606, such as an oxide layer, a nitride layer, SiON layer, or a high-k gate dielectric, resides on top of the semiconductor substrate 602 and can help protect the semiconductor body during future etching steps. Over the base dielectric layer 606, a layer of sacrificial spacer material 608 is formed. In some embodiments, the sacrificial spacer material comprises SiN, SiC and/or SiO2. A mask 610, such as a layer of patterned photoresist for example, is formed on top of the sacrificial spacer material 608.

Figure 7:
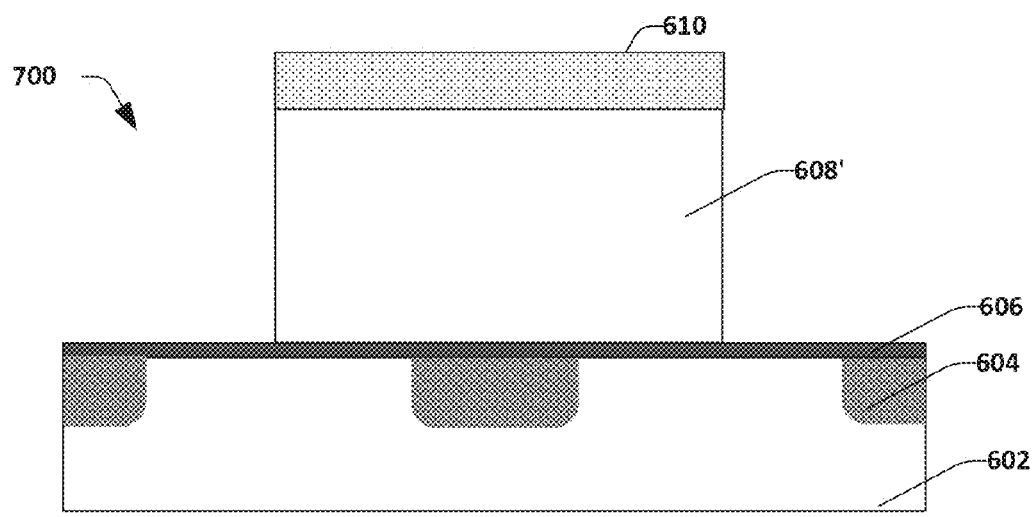

FIG. 7 illustrates a cross-sectional view of a semiconductor body 700, after the sacrificial spacer material 608 has been patterned with the mask 610 in place to form a sacrificial spacer 608' having sidewalls and top surface. In some embodiments the sacrificial spacer 608' may be formed by carrying out either a plasma or reactive ion etch (RIE) or a selective wet etch while the mask 610 is in place. A source/drain region which is covered by the patterned sacrificial spacer, is a common or shared source/drain region, while other source/drain regions which are left uncovered by the patterned sacrificial spacer, can correspond uniquely to a different split gate memory cells. After the sacrificial spacer 608' is patterned, the mask 610 can be removed.

Figure 8:
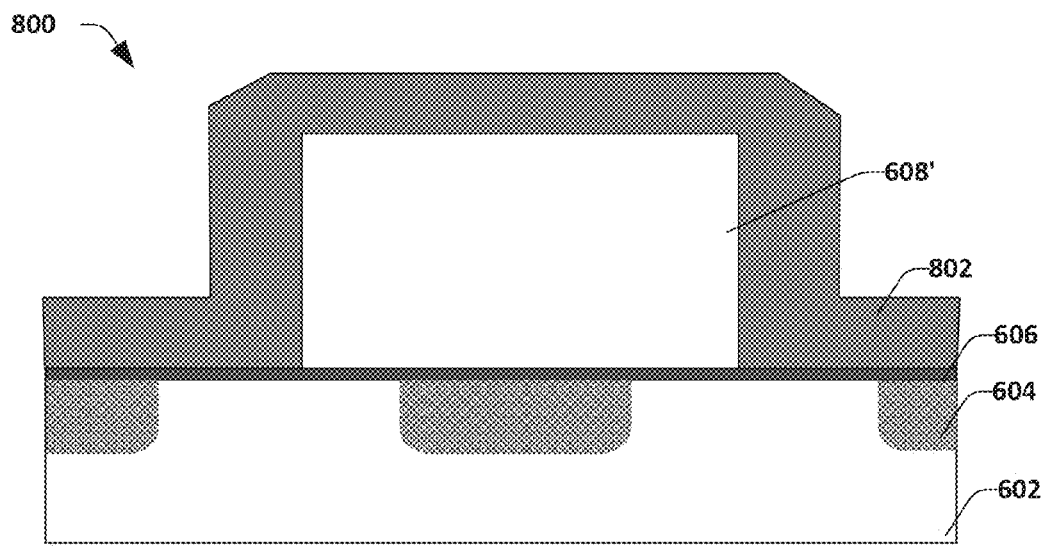

FIG. 8 illustrates a cross-sectional view of a semiconductor body 800, after forming a layer of SG material 802 over the base dielectric 606 as well as over the sacrificial spacer 608'. As will be appreciated further herein, this SG material 802 can be made of doped polysilicon in some embodiments. In other embodiments, the SG material layer 802 can be a metal layer.

Figure 9:
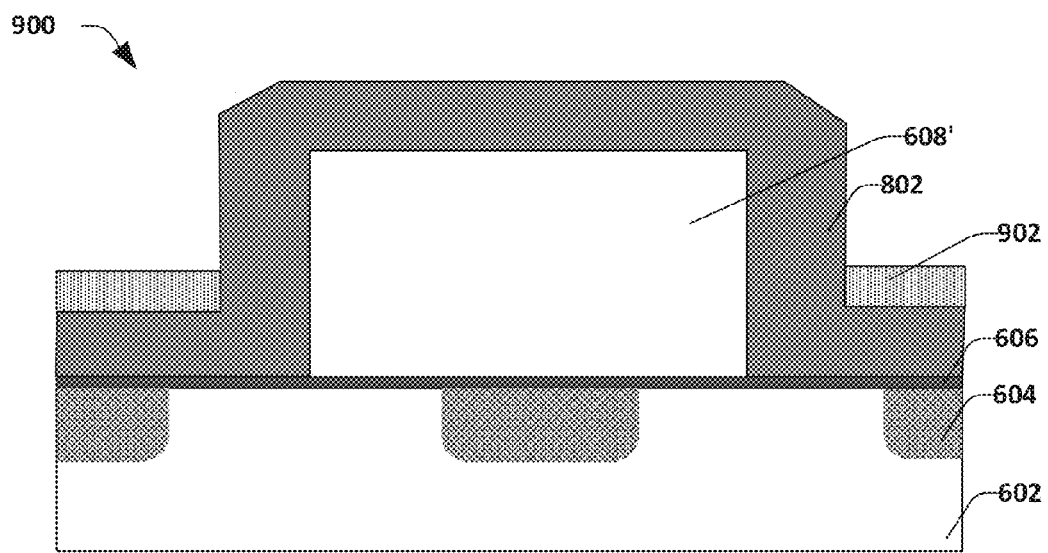

FIG. 9 illustrates a cross-sectional view of a semiconductor body 900, after depositing an etch protection layer 902 on regions of the substrate not covered by the patterned sacrificial spacer 608'. Thus, the etch protection layer 902 can be formed on either side of the sacrificial spacer 608' to protect covered regions of the SG material layer 802 from an upcoming etch-back process. In some embodiments, the etch protection layer 902 comprises a BARC (bottom anti-reflective coating) material.

Figure 10:
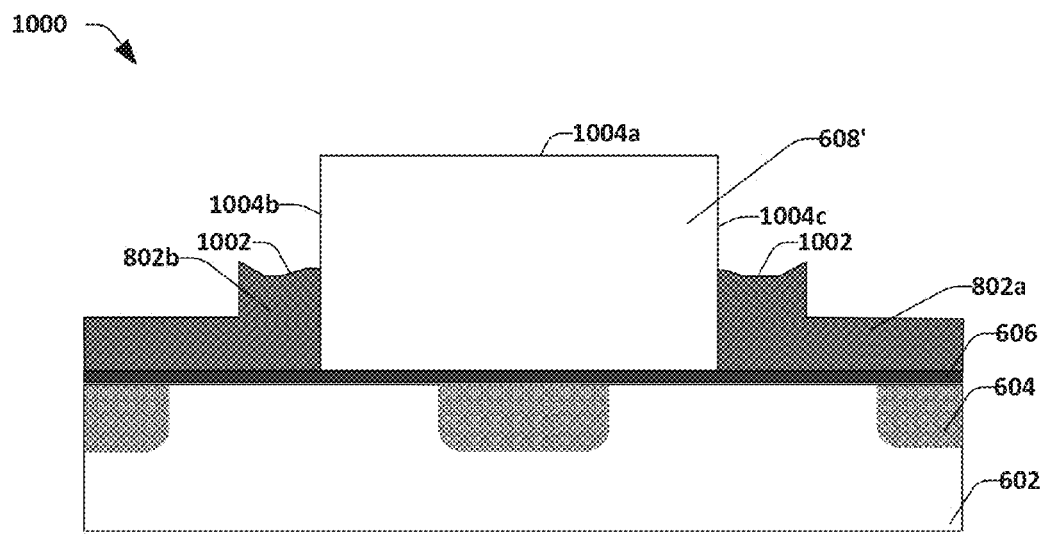

FIG. 10 illustrates a cross-sectional view of after performing a first etch-back process on the SG material 802. The first etch-back process removes portions of the SG material layer 802 to expose the top surface 1004a and upper sidewall regions 1004b, 1004c of the sacrificial spacer 608'. Thus, the first etch-back process leaves portions 802a, 802b of the SG material covering lower sidewall regions of the sacrificial spacer 608'. After etching, height of the SG material can be reduced to approximately half of a height level of the sacrificial spacer 608'. In some embodiments, the remaining portion of the SG material layer has top surfaces 1002 that have a curved geometry with an indention in a central region thereof. The etch protection layer 902 protects the SG material over the source/drain regions and is removed after the first etch-back process.

Figure 11:
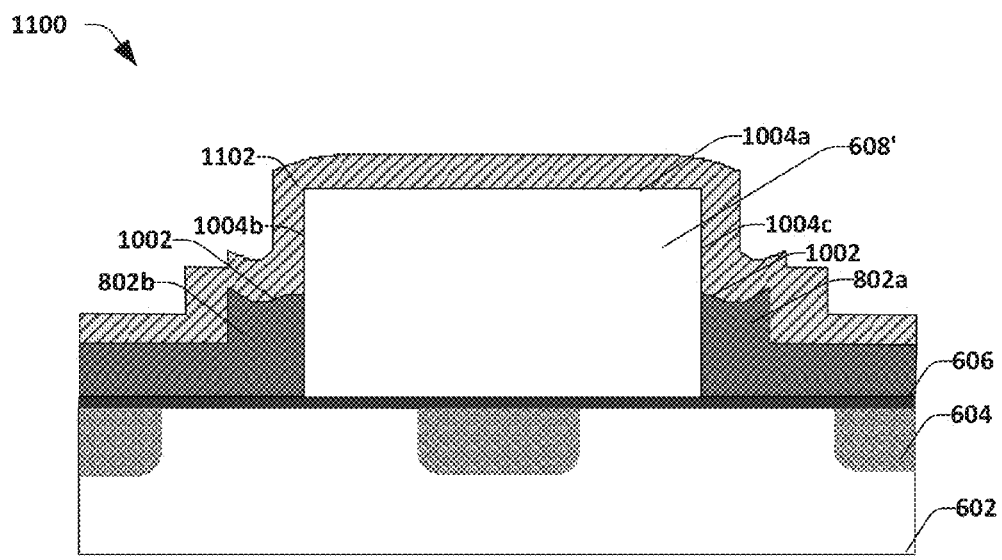

FIG. 11 illustrates a cross-sectional view after a conformal silicide-blocking layer 1102 has been formed. The silicide-blocking layer 1102 extends over the top surfaces 1002 of the remaining portion of the SG material layer, and also extends over the top surface 1004a and upper sidewall regions 1004b, 1004c of the sacrificial spacer 608'. In some embodiments, the silicide-blocking layer 1102 comprises SiO2 (silicon dioxide).

Figure 12:
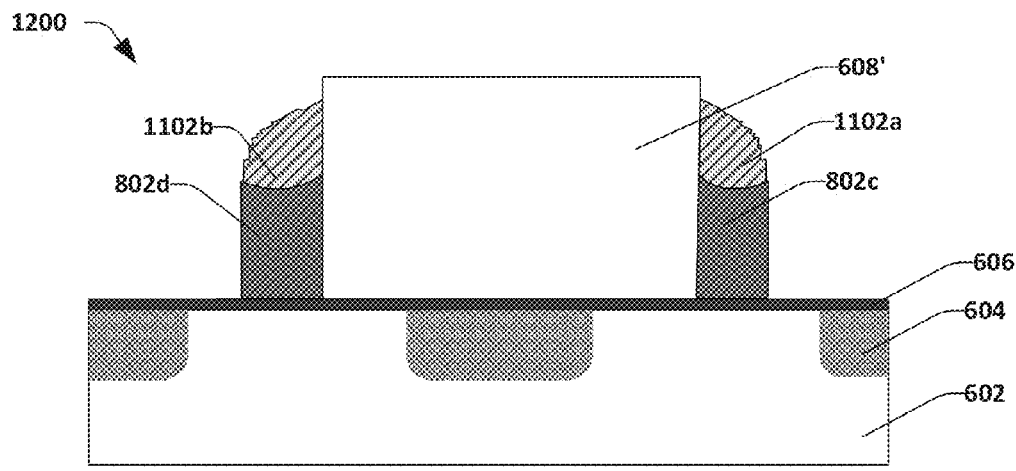

FIG. 12 illustrates a cross-sectional view of a semiconductor body 1200, after a second etch back procedure has been performed. This second etch back procedure etches away the portions of the SG material layer 802 over the source/drain regions; and also removes the silicide-blocking layer 1102 from over the top surface of the sacrificial spacer 608'. Thus, the second etch back process results in first and second silicide-blocking caps 1102a, 1102b that are arranged over first and second select gates 802c, 802d respectively. In some embodiments, the second etch back process comprises a wet etch, but could also be a dry etch, such as a plasma etch or RIE procedure.

Figure 13:
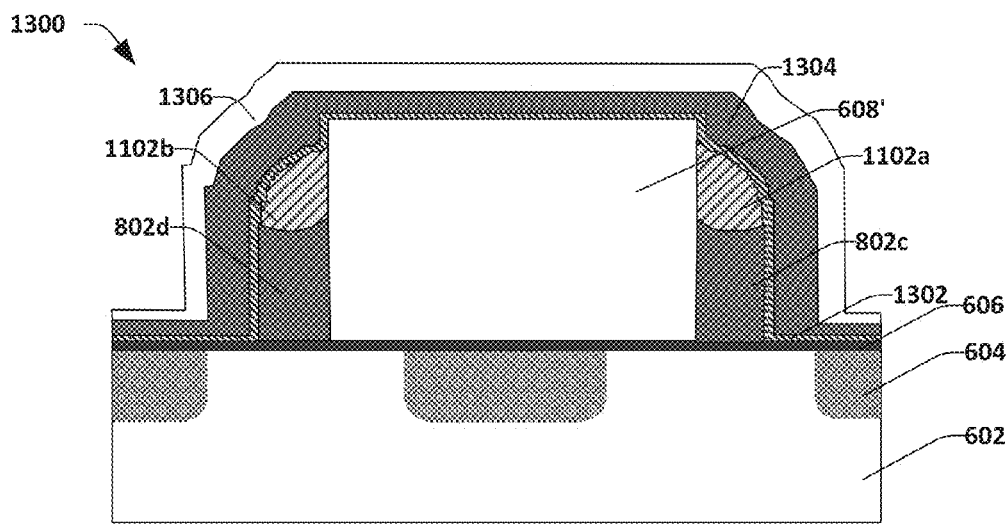

FIG. 13 illustrates a cross-sectional view of a semiconductor body 1300, after forming a charge-trapping layer 1302, a MG material layer 1304 and a dielectric spacer layer 1306 over the entire semiconductor body 602. In some embodiments, the MG layer 1304 comprises poly silicon and the dielectric spacer layer 1306 comprises SiO2.

Figure 14A:
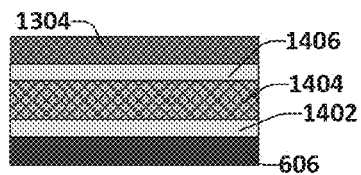

FIG. 14a illustrates a cross sectional view of an embodiment of charge-trapping layer 1302. In this example, charge-trapping layer 1302 comprises a first oxide layer 1402, a nitride layer 1404 and a second oxide layer 1406. During operation of the memory cell, the first and/or second oxide layers 1402, 1406 are structured to promote electron tunneling to and from the nitride layer 1404, such that the nitride layer 1404 can retain trapped electrons that alter the threshold voltage of the cell in a manner that corresponds to a data state stored in the cell.

Figure 14B:
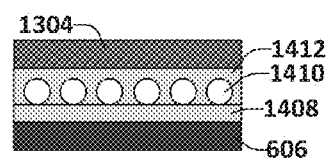

FIG. 14b illustrates a cross sectional view of an alternate embodiment of charge-trapping layer 1302. In this example, charge-trapping layer 1302 comprises a first oxide layer 1408, a layer of silicon dots 1410, and a second oxide layer 1412. During operation of the memory cell, the first and/or second oxide layers 1408, 1412 are structured to promote electron tunneling to and from the layer of silicon dots 1410, such that charge can become trapped on the silicon dots and alter the threshold voltage of the cell in a manner that corresponds to a data state stored in the cell. In some embodiments, the Si dots have diameters ranging from approximately 5 nm to approximately 20 nm.

Figure 15:
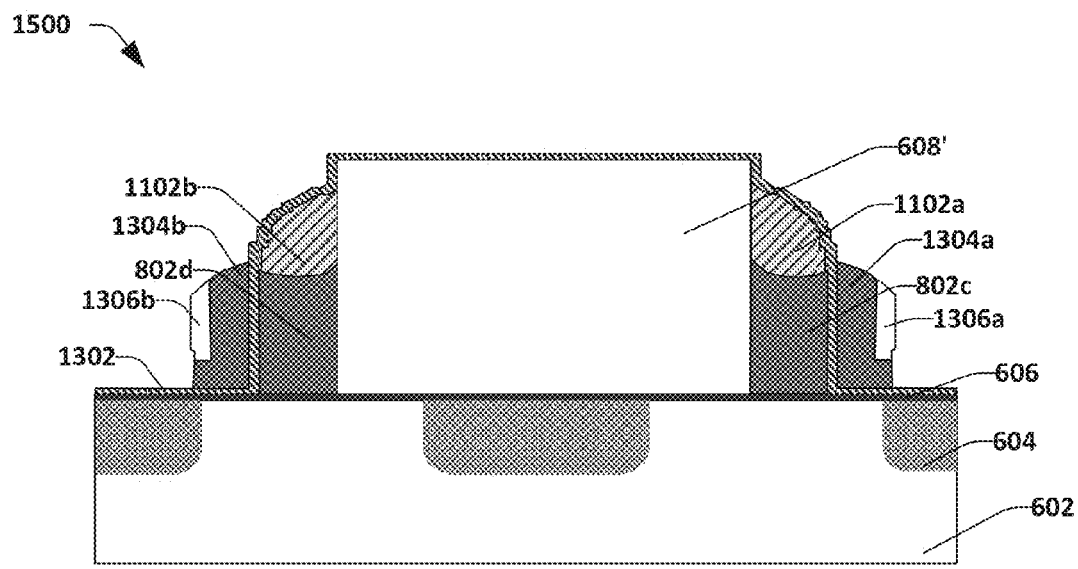

FIG. 15 illustrates a cross sectional view of a semiconductor body 1500, after etching parts of the oxide layer 1306 and the MG material layer 1304 to form a pair of MGs 1304a, 1304b on either side of the sacrificial spacer 608' adjacent the outer side walls of SGs 802c and 802d. Dielectric sidewall spacers 1306a, 1306b are also formed, being made out of oxide, for example. The MGs 1304a, 1304b extend under the dielectric spacers 1306a, 1306b. In some embodiments, the MG material layer 1304 and the dielectric spacer layer 1306 are etched off using wet etching.

Figure 16:
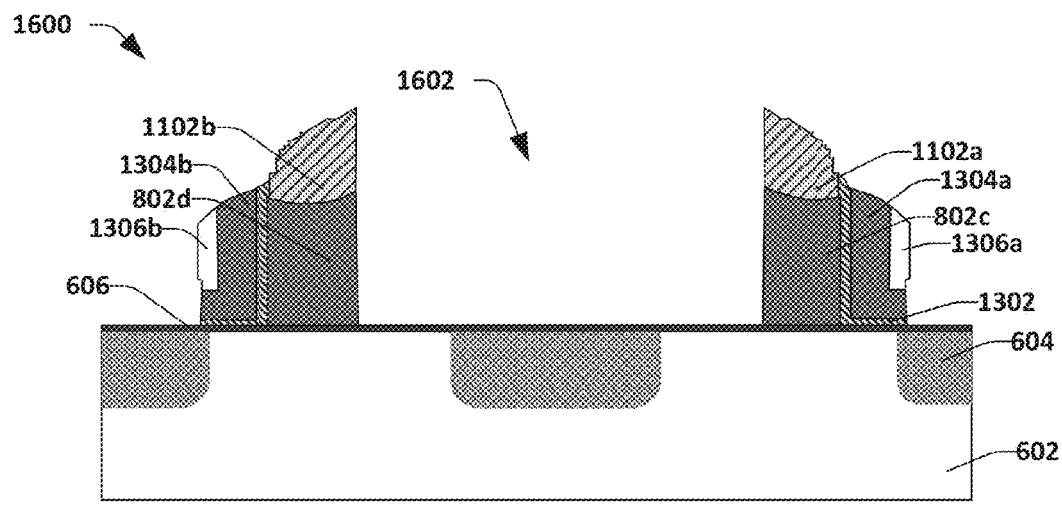

FIG. 16 illustrates a cross sectional view of a semiconductor body 1600, after removing exposed parts of the charge-trapping layer 1302 and the sacrificial spacer 608' to form a recess 1602. This etching exposes the base dielectric layer 606 in regions where there are no SGs or MGs. In some embodiments, the charge-trapping layer 1302 and the sacrificial spacer 608' are removed using a wet etchant combination of HF+H3PO4.

Figure 17:
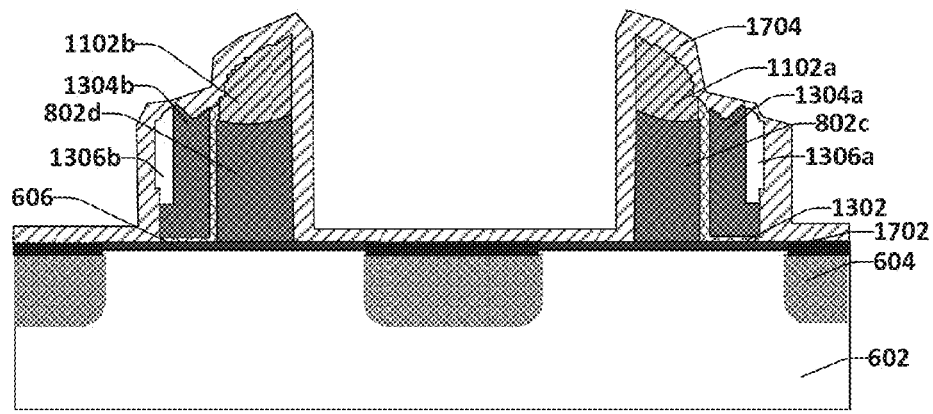

FIG. 17 illustrates a cross sectional view of a semiconductor body 1700, after etching away exposed regions of the base dielectric layer 606, forming a base salicide 1702 on upper regions of the source/drain regions 604, performing an etch-back process on the top surfaces of the MGs 1304a and 1304b, while a BARC layer (not shown) overlies the base salicide layer 1702 and protects the rest of the semiconductor body, and forming a CESL layer 1704 encapsulating the gate structures and the base of the semiconductor body 602. In some embodiments, the base salicide layer 1702 comprises NiSi and the CESL layer comprises SiN and the dielectric sidewall spacers 1306a and 1306b comprise a nitride. The etch back process performed on the MGs gives a non-planar/curved geometry for their top surfaces and makes sure the MG poly layer is protected with the CESL layer from future polishing steps.

Figure 18:
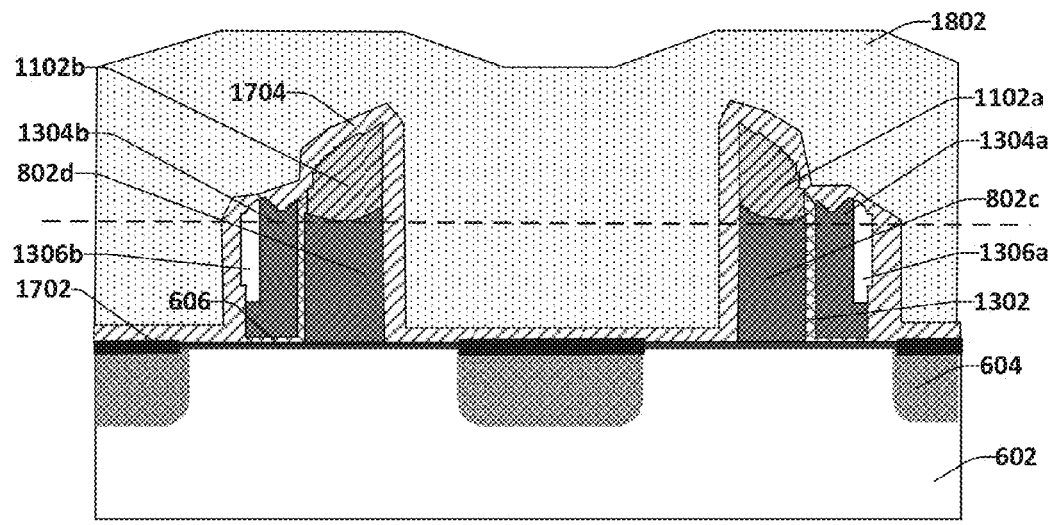

FIG. 18 illustrates a cross sectional view of a semiconductor body 1800, after depositing an ILD layer 1802 entirely over the semiconductor body. In some embodiments, the ILD layer 1802 comprises SiO2 or TEOS (tetetraethylorthosilicate), but the ILD layer can also be a low-k dielectric with a dielectric constant of less than about 2.8.

Figure 19:
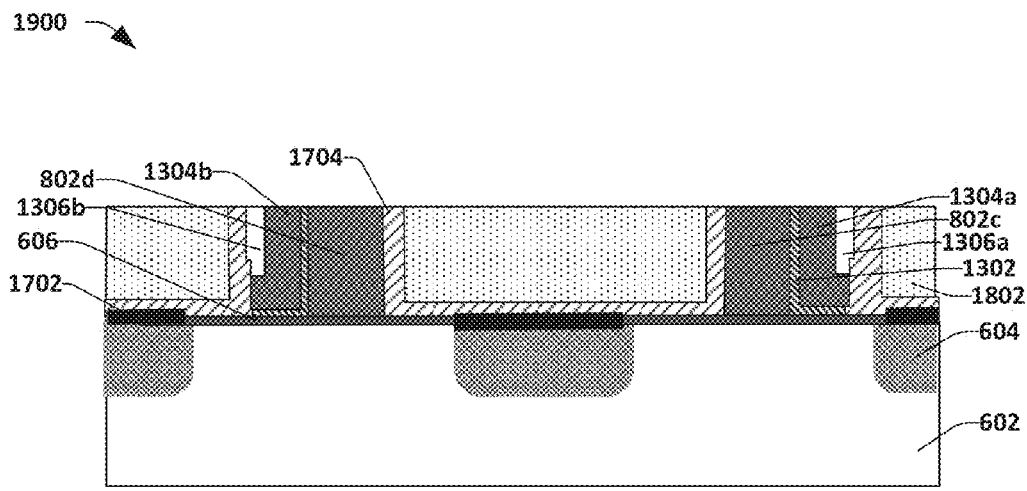

FIG. 19 illustrates a cross sectional view of a semiconductor body 1900, after performing CMP (chemical mechanical polishing) on the ILD layer 1802. This CMP process polishes until a height level of the CESL layer on top of the MG is reached, and thus reduces height of the SG structures to that level.

Figure 20:
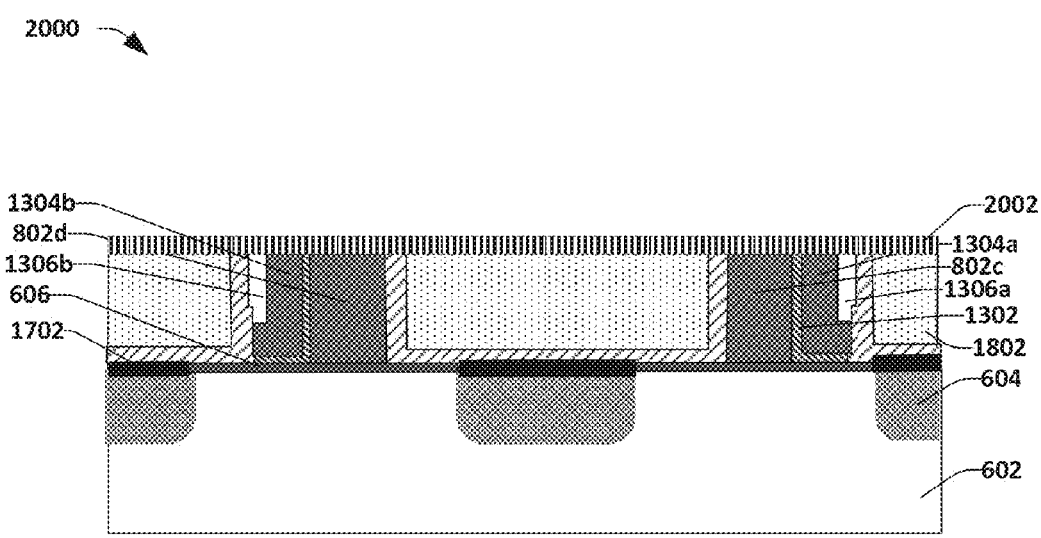

FIG. 20 illustrates a cross sectional view of a semiconductor body 2000, after forming a hard mask layer 2002 over the entire semiconductor body. This layer protects the HKMG circuit and parts of the flash memory cells during the second silicide formation.

Figure 21:
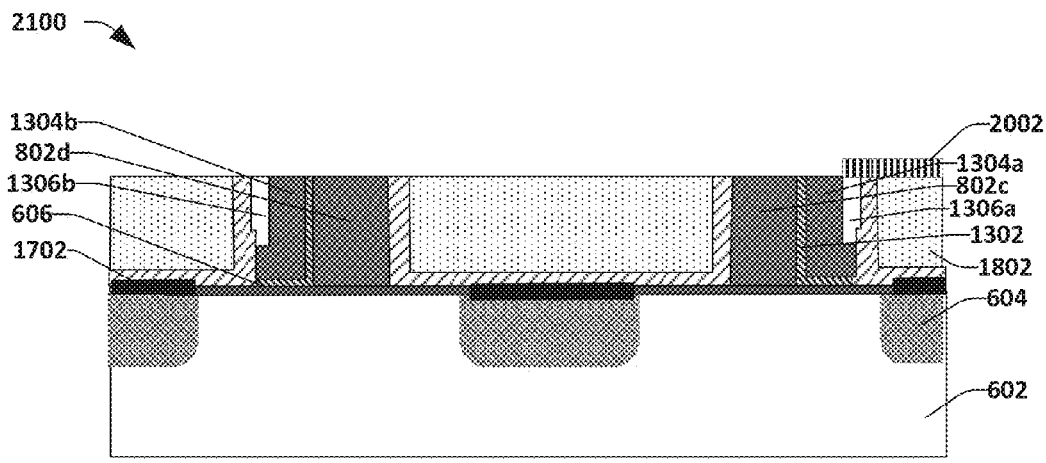

FIG. 21 illustrates a cross sectional view of a semiconductor body 2100 after performing a lithographic patterning and etch on the hard mask layer, to create open areas on the flash memory for a second salicide formation. Portion of the hard mask layer 2002 can still be seen over the rest of the circuit, protecting it from silicide formation. In some embodiments, mask 2002 may be left partially over SG 1306b and/or MG 1304b to help prevent voltage breakdown, as later shown in FIGS. 24-29, for example.

Figure 22:
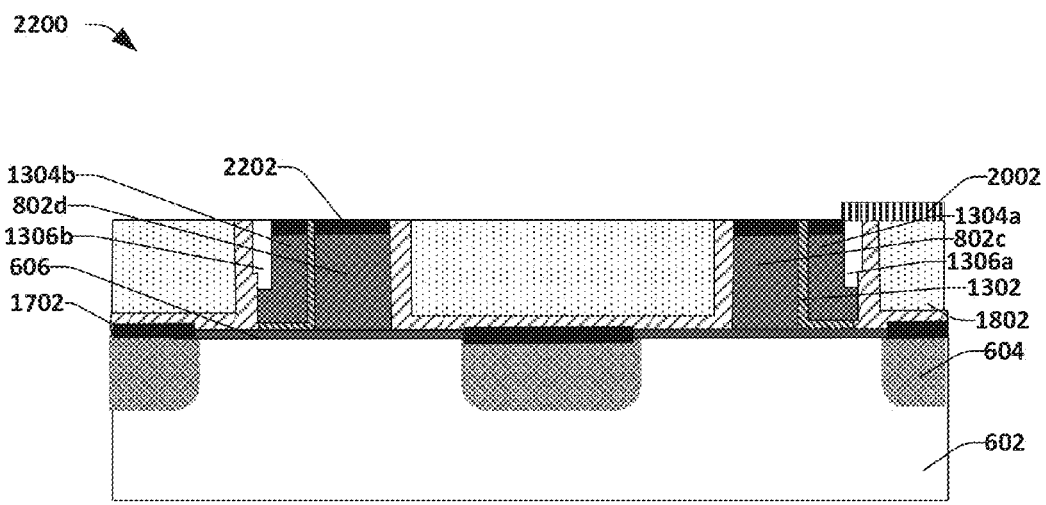

FIG. 22 illustrates a cross sectional view of a semiconductor body 2200 after forming a salicide layer 2202 over the top surfaces of the SGs 802c, 802d and MGs 1304a, 1304b of the flash memory cells. This salicide layer 2202 forms a better contact surface for the metal contacts formed in a later step and thus reduces contact resistance. In some embodiments, salicide 2202 comprises NiSi.

Figure 23:
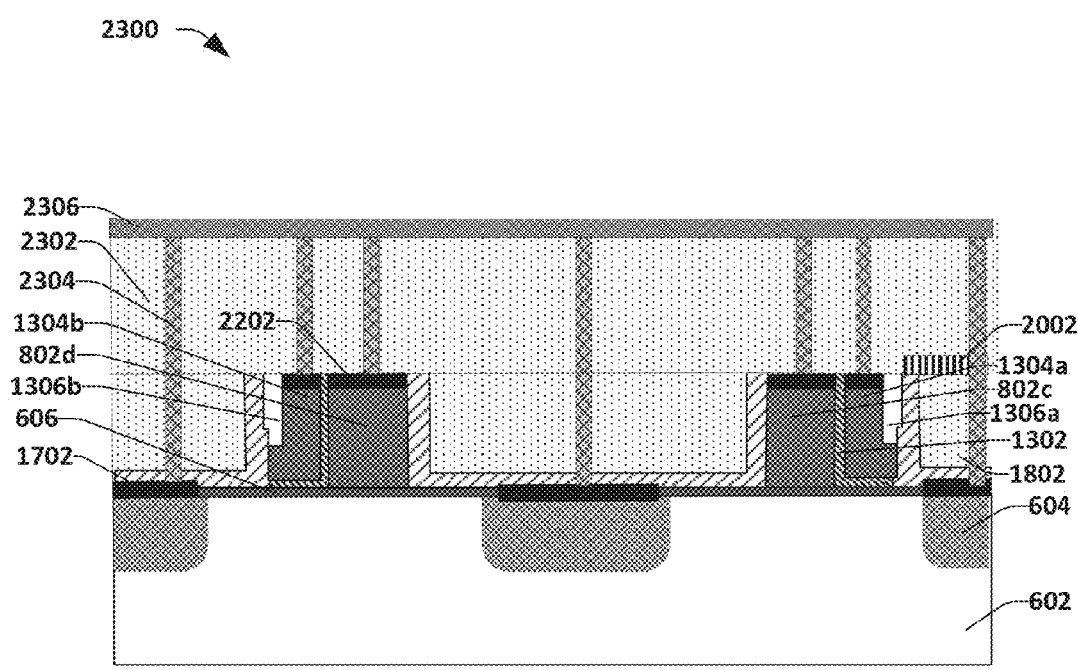

FIG. 23 illustrates a cross sectional view of a semiconductor body 2300, after depositing a second ILD layer 2302 and forming metal contacts 2304. Metal contacts 2304 extend downward to the silicides 1702 on upper portion of source/drain (S/D) regions 604, and can comprise Ti/TiN as a buffer layer which is filled with W in some embodiments. A protective barrier layer 2306 is also formed over the ILD layer 2302 and the metal contacts 2304. In some embodiments, the protective barrier layer comprises BPTEOS (borophosphorous tetraethylorthosilicate).

FIGS. 24-29 illustrate different embodiments of forming the silicide layer over top surfaces of the gate structures of an embedded memory cell, according to the present disclosure.

Figure 24:
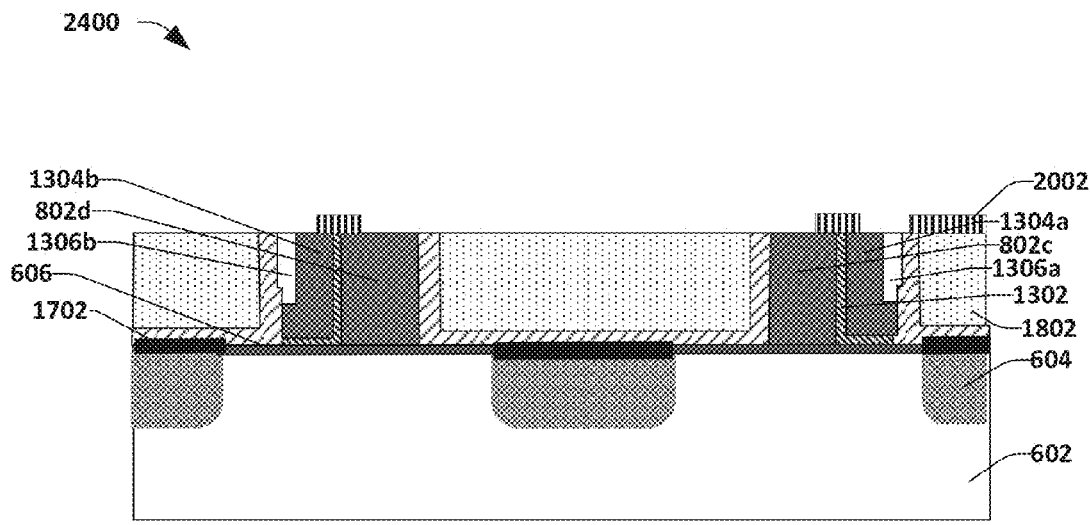
FIGS. 24-29 illustrate different embodiments of forming the silicide layer over top surfaces of the gate structures of an embedded memory cell, according to the present disclosure.

FIG. 24 illustrates a cross sectional view of a semiconductor body 2400 after performing a high resolution patterning and etch on the hard mask layer 2002, to create open areas on the flash memory for a second salicide formation. Here, portion of the hard mask layer 2002 can be seen covering top surfaces of the SGs 802c, 802d and MGs 1304a, 1304b partially, as well as top surface of the charge-trapping layer 1302 and the rest of the circuit, protecting it from silicide formation.

Figure 25:
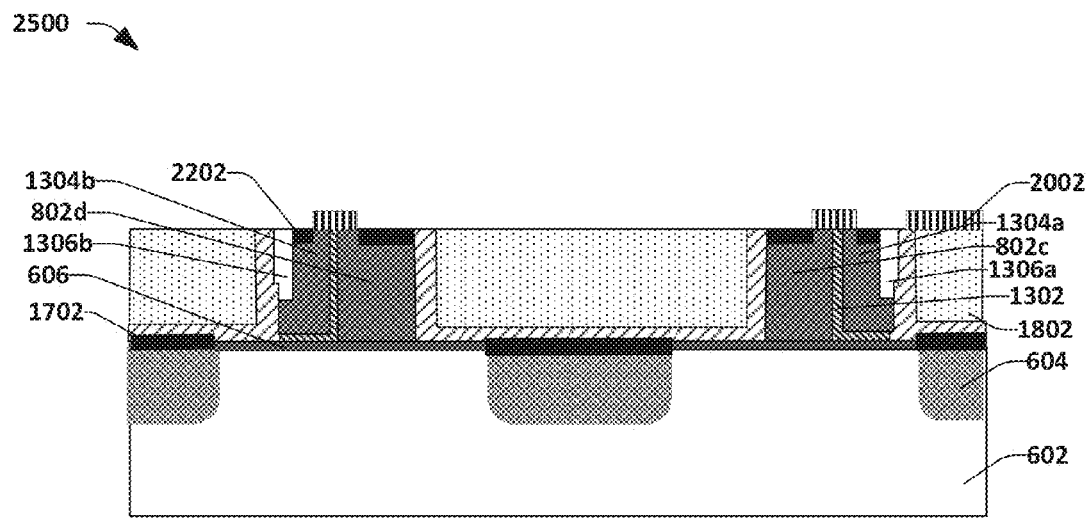

FIG. 25 illustrates a cross sectional view of a semiconductor body 2500 after forming a salicide layer 2202 partially over the top surfaces of the SGs 802c, 802d and MGs 1304a, 1304b of the flash memory cells. Partial salicide formation prevents the risk of a potential breakdown between the SGs and the MGs. This salicide layer 2202 forms a better contact surface for the metal contacts formed in a later step and thus reduces contact resistance.

Figure 26:
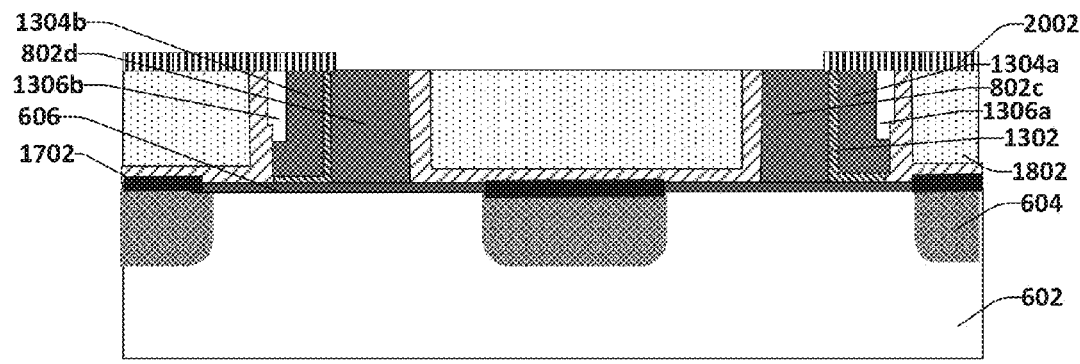

FIG. 26 illustrates a cross sectional view of a semiconductor body 2600 after performing a high resolution patterning and etch on the hard mask layer 2002, to create open areas on the flash memory for a second salicide formation. Here, portion of the hard mask layer 2002 can be seen covering top surfaces of the MGs 1304a, 1304b, top surface of the charge-trapping layer 1302 and the rest of the circuit, protecting it from silicide formation.

Figure 27:
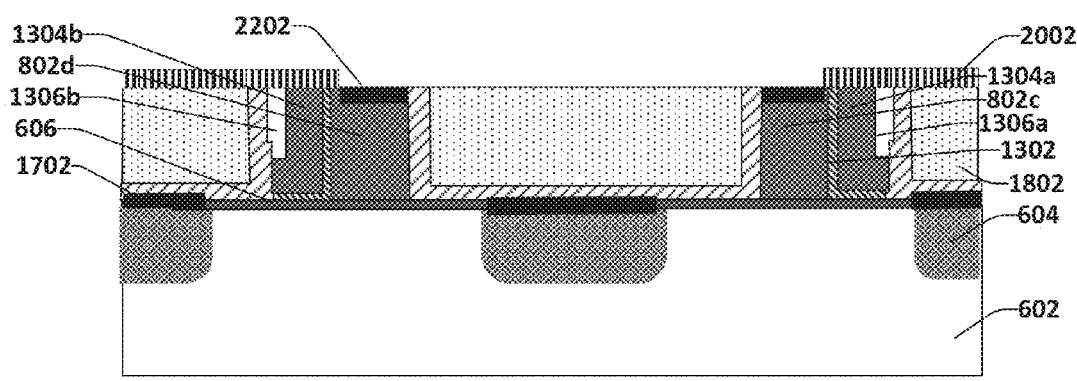

FIG. 27 illustrates a cross sectional view of a semiconductor body 2700 after forming a salicide layer 2202 over the top surfaces of the SGs 802c, 802d of the flash memory cells. This salicide layer 2202 forms a better contact surface for the metal contacts formed in a later step and thus reduces contact resistance.

Figure 28:
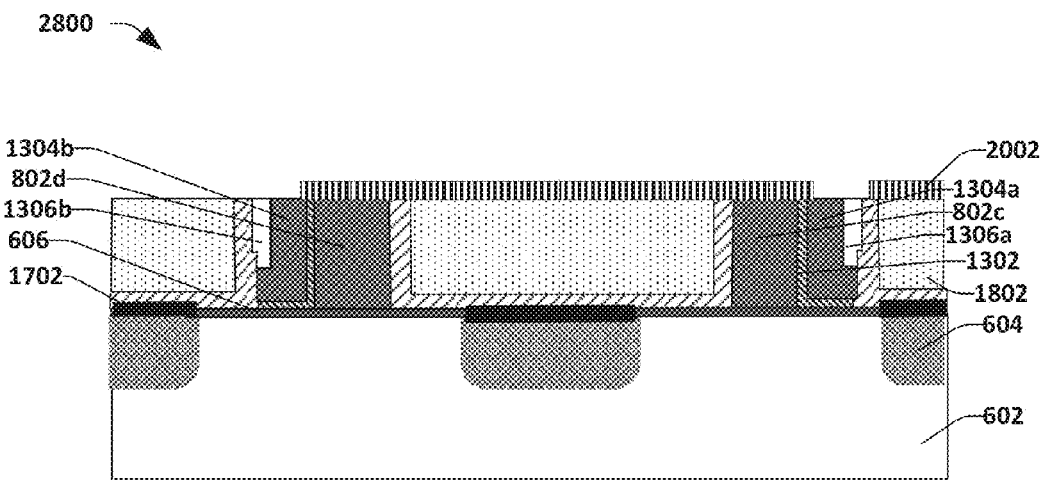

FIG. 28 illustrates a cross sectional view of a semiconductor body 2800 after performing a high resolution patterning and etch on the hard mask layer 2002, to create open areas on the flash memory for a second salicide formation. Here, portion of the hard mask layer 2002 can be seen covering top surfaces of the SGs 802c, 802d, top surface of the charge-trapping layer 1302 and the rest of the circuit, protecting it from silicide formation.

Figure 29:
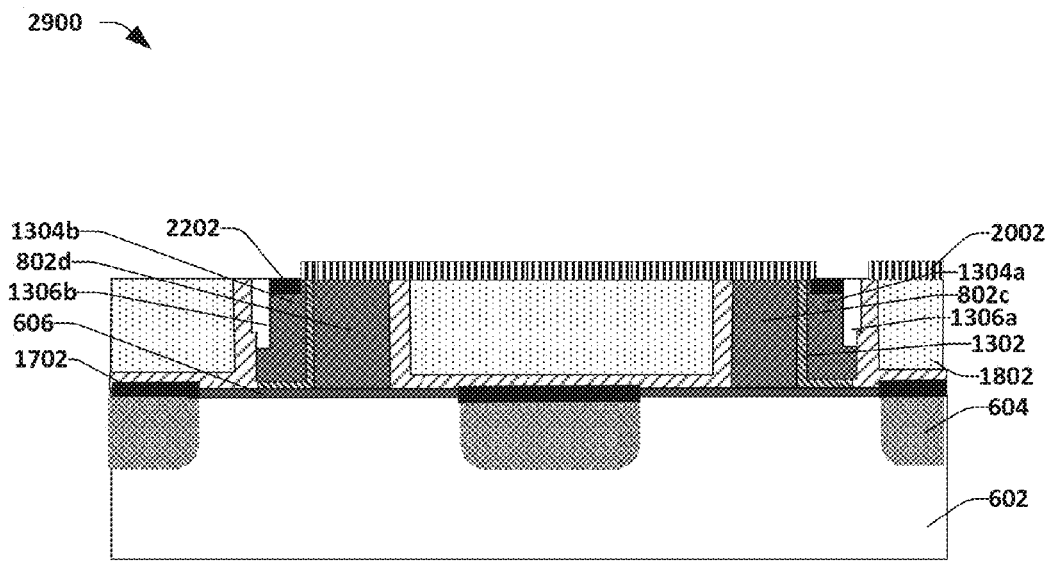

FIG. 29 illustrates a cross sectional view of a semiconductor body 2900 after forming a salicide layer 2202 over the top surfaces of the MGs 1304a, 1304b of the flash memory cells. This salicide layer 2202 forms a better contact surface for the metal contacts formed in a later step and thus reduces contact resistance.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a structure and method for embedding a NVM in a HKMG circuit, that has reduced poly resistance and high program/erase speed. A silicide layer is formed over top surfaces of the gates of the NVM after the replacement gate process of the HKMG circuit, which provides better contact resistance improves the speed of the memory cell operation. The HKMG circuit and portions of the memory cell that needs to be protected from this silicide formation is covered using a hard mask layer. The structural features of this disclosure include dual silicide formation and dual dielectric formation (regions where the hard mask and the CESL are present).

In some embodiments, the present disclosure relates to an integrated circuit (IC) comprising, a semiconductor substrate including a periphery region and a memory cell region, a high k metal gate (HKMG) circuit disposed on the periphery region, a first memory cell formed on the memory cell region, comprising a select gate (SG) and a memory gate (MG), and a silicide layer disposed on top surfaces of the SG or the MG of the first memory cell.

In another embodiment, the present disclosure relates to an integrated circuit (IC) comprising, a semiconductor substrate including a periphery region and a memory cell region, a HKMG (high k metal gate) circuit disposed on the periphery region, two neighboring split gate flash memory cells formed on the memory cell region, each memory cell including a select gate (SG) and a memory gate (MG), wherein top surfaces of the HKMG circuit and the split gate flash memory cells are co-planar, and a silicide layer disposed on top surfaces of the SG or the MG of both split gate flash memory cells.

In yet another embodiment, the present disclosure relates to a method of forming an integrated circuit (IC) comprising, forming a pair of memory cells over a first region on a semiconductor substrate, each memory cell comprising a select gate (SG) and a memory gate (MG), forming a high-k metal gate (HKMG) circuit over a second region on the semiconductor substrate, performing chemical mechanical polishing (CMP) to make top surfaces of the memory cells and the HKMG circuit co-planar, forming a hard mask layer over the top surfaces of the memory cells and the HKMG circuit, selectively removing the hard mask layer to expose top surfaces of the SGs or MGs of the memory cells partially or completely, and forming a self-aligned silicide (salicide) layer over the exposed top surfaces of the memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
    a semiconductor substrate including a periphery region and a memory cell region;
    a high-k metal gate (HKMG) gate electrode disposed on the periphery region;
    a first memory cell disposed on the memory cell region, comprising a select gate (SG) and a memory gate (MG);
    a silicide layer disposed on a SG top surface or a MG top surface of the first memory cell;
    a hard mask layer in contact with an upper surface of the HKMG gate electrode; and
    metal contacts extending into the silicide layer on the SG top surface or the MG top surface.

2. The IC of claim 1, wherein a second memory cell, which is a mirror image of the first memory cell is disposed adjacent to the first memory cell.

3. The IC of claim 1, wherein:
    the silicide layer is disposed on top surfaces of both the MG and the SG of the first memory cell.

4. The IC of claim 3, wherein the first memory cell further comprises:
    a charge-trapping layer arranged between neighboring sidewalls of the MG and the SG, the charge trapping layer extending under the MG; and
    a sidewall spacer abutting an outer side wall of the MG.

5. The IC of claim 4, further comprising:
    a base dielectric layer disposed above a base surface of the semiconductor substrate below the SG and the charge-trapping layer;
    a base silicide layer disposed over a base surface of the semiconductor substrate on active regions of the semiconductor substrate; and
    a CESL (contact etch stop layer) disposed above the base silicide layer in the active regions.

6. The IC of claim 4, wherein:
    the silicide layer is disposed partially, but not entirely, on the SG top surfaces and the MG top surface of the first memory cell; and
    the hard mask layer is disposed over a top surface of the charge-trapping layer.

7. The IC of claim 4, wherein:
    the silicide layer is disposed on the SG top surface of the first memory cell; and
    the hard mask layer is disposed over top surfaces of the HKMG gate electrode, the charge trapping layer, the MG, and the sidewall spacer.

8. The IC of claim 5, wherein:
    the silicide layer is disposed on of the MG top surface of the first memory cell; and
    the hard mask layer is disposed over top surfaces of the HKMG gate electrode, the SG, the charge trapping layer, the sidewall spacer and the CESL layer.

9. The IC of claim 5, wherein:
    the MG and the SG comprise polysilicon;
    the semiconductor substrate comprises Si;
    the silicide layer comprises NiSi (nickel silicide);
    the CESL comprises SiN (silicon nitride); and
    the hard mask-layer comprises SiO2 (silicon oxide), SiN or SION.

10. The IC of claim 1, wherein the hard mask layer abuts a portion of the SG top surface not covered by the silicide layer or a portion of the MG top surface not covered by the silicide layer.

11. An integrated circuit (IC) comprising:
    a semiconductor substrate including a periphery region and a memory cell region;
    a HKMG (high-k metal gate) circuit disposed on the periphery region;
    two neighboring split gate flash memory cells arranged on the memory cell region, each memory cell including a select gate (SG) and a memory gate (MG), wherein top surfaces of the HKMG circuit and the split gate flash memory cells are co-planar;
    a silicide layer disposed on a SG top surface or a MG top surface of both split gate flash memory cells;
    a hard mask layer disposed over upper surfaces of gate electrodes within the HKMG circuit; and
    a CESL (contact etch stop layer) disposed between the semiconductor substrate the hard mask layer; and
    a metal contact vertically extending to the HKMG gate electrode through the hard mask layer and a dielectric layer overlying the hard mask layer.

12. The IC of claim 11, wherein the hard mask layer is disposed on a portion of the SG top surface not covered by the silicide layer or on a portion of the MG top surface not covered by the silicide layer.

13. The IC of claim 12, wherein the hard mask layer is further disposed partially, but not entirely, over top surfaces of a charge-trapping layer and the SG of each memory cell.

14. The IC of claim 12, wherein the HKMG circuit comprises a HV (high voltage) HKMG transistor and a HKMG periphery circuit.

15. The IC of claim 14, wherein the HKMG circuit comprises a static random access memory (SRAM) cell, an input/output cell or a core cell.

16. The IC of claim 12, further comprising:
    an ILD (inter-layer dielectric) layer disposed above top surfaces of the split gate flash memory cells and the HKMG circuit;
    metal contacts extending to active regions on the substrate and to top surfaces of the MG and SG, wherein metal contacts perforate through the ILD layer and the hard mask layer; and
    a protective barrier layer disposed above the metal contacts and the ILD layer.

17. A method of forming an integrated circuit (IC) comprising:
    forming a pair of memory cells over a first region on a semiconductor substrate, each memory cell comprising a select gate (SG) and a memory gate (MG);
    forming a high-k metal gate (HKMG) circuit over a second region on the semiconductor substrate;
    performing chemical mechanical polishing (CMP) to make top surfaces of the memory cells and the HKMG circuit co-planar;
    forming a hard mask layer over the top surfaces of the memory cells and the HKMG circuit;

selectively removing the hard mask layer to expose top surfaces of the SG or MG of the memory cells partially or completely;

forming a self-aligned silicide (salicide) layer over the exposed top surfaces of the memory cells;

forming a first inter-layer dielectric (ILD) layer over top surfaces of the pair of memory cells and the HKMG circuit; and forming metal contacts extending to the silicide layer.

18. The method of claim 17, wherein forming the pair of memory cells comprises:

forming a sacrificial spacer over the semiconductor substrate;

forming a select gate (SG) material layer over a top surface and sidewalls of the sacrificial spacer;

performing a first etch back process on the SG material layer to expose the top surface of the sacrificial spacer and upper sidewall regions of the sacrificial spacer and thereby forming a first and second SG structures;

forming a conformal silicide-blocking layer that extends over the first and second SG structures and over the top surface of the sacrificial spacer;

performing a second etch back process to remove the conformal silicide-blocking layer from over the top surface of the sacrificial spacer while leaving a portion on the first and second SG structures and thereby forming first and second silicide-blocking caps;

forming a conformal charge-trapping layer extending over the top surface of the sacrificial spacer and over the first and second silicide-blocking caps;

forming a conformal memory gate (MG) material layer over the charge-trapping layer;

forming a conformal dielectric spacer layer over the conformal MG material layer; and performing a third etch back procedure to remove portions of the conformal charge-trapping layer, portions of the conformal MG material layer, and portions of the conformal spacer dielectric layer, to thereby form first and second self-aligned MG structures on outermost sidewalls of the first and second SG structures, respectively.

19. The method of claim 18, further comprising:

forming source/drain regions in the semiconductor substrate;

removing the sacrificial spacer to form a recess between inner sidewalls of the first and second SG structures;

forming the silicide layer on the semiconductor substrate in the recess and over the source/drain regions;

forming a conformal contact etch-stop layer (CESL) on the semiconductor substrate in the recess and over the SG and MG structures;

forming a second ILD layer extending over the CESL and extending downwardly into the recess; and performing a chemical mechanical polishing (CMP) operation on the first ILD layer.

20. The method of claim 19, further comprising:

depositing a protective barrier layer over the first ILD layer and over top surfaces of the metal contacts.

* * * * *